United States Patent
Holveck et al.

(10) Patent No.: US 12,088,087 B2
(45) Date of Patent: *Sep. 10, 2024

(54) SMART GRID INTERFACE RELAY AND BREAKER

(71) Applicant: Lunar Energy, Inc., Mountain View, CA (US)

(72) Inventors: Mark Holveck, Sunnyvale, CA (US); Randol Aikin, Sunnyvale, CA (US); Mark Daniel Goldman, Los Altos Hills, CA (US); Kyle Breuning Evans, Auburn, CA (US)

(73) Assignee: Lunar Energy, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/368,852

(22) Filed: Sep. 15, 2023

(65) Prior Publication Data

US 2024/0154403 A1 May 9, 2024

Related U.S. Application Data

(63) Continuation of application No. 18/085,947, filed on Dec. 21, 2022, now Pat. No. 11,862,962.

(60) Provisional application No. 63/293,014, filed on Dec. 22, 2021.

(51) Int. Cl.
*H02H 5/04* (2006.01)
*H02H 1/00* (2006.01)
*H02H 3/02* (2006.01)
*H02H 3/093* (2006.01)
*G01R 31/317* (2006.01)

(52) U.S. Cl.
CPC .......... *H02H 5/041* (2013.01); *H02H 1/0061* (2013.01); *H02H 3/021* (2013.01); *H02H 3/093* (2013.01); *G01R 31/31726* (2013.01)

(58) Field of Classification Search
CPC ...................................... H02H 5/041
See application file for complete search history.

(56) References Cited

U.S. PATENT DOCUMENTS

| | | | | |
|---|---|---|---|---|
| 3,358,250 | A * | 12/1967 | Hoffmann | H02H 11/00 335/34 |
| 5,196,658 | A | 3/1993 | Gula | |
| 5,655,648 | A | 8/1997 | Rosen | |
| 11,862,962 | B2 * | 1/2024 | Holveck | H02H 3/093 |
| 2009/0195349 | A1 | 8/2009 | Frader-Thompson | |
| 2010/0038966 | A1 * | 2/2010 | Espeut, Jr. | H02J 3/14 335/73 |
| 2012/0123762 | A1 | 5/2012 | Studer, II | |

(Continued)

OTHER PUBLICATIONS

Smart Breakers—Wi-Fi Circuit Breakers. Eaton. Oct. 10, 2021. https://web.archive.org/web/20211010025927/https://www.eaton.com/us/en-us/catalog/electrical-circuit-protection/energy-management-circuit-breaker.html.

*Primary Examiner* — Jared Fureman
*Assistant Examiner* — Christopher J Clark
(74) *Attorney, Agent, or Firm* — Van Pelt, Yi & James LLP

(57) ABSTRACT

A controllable main breaker includes a main breaker sized to fit within an existing panel slot of an electrical panel. The main breaker comprises a trigger to open the main breaker in response to a thermal fault or overcurrent event. The controllable main breaker further includes an auxiliary shell sized to fit within at least one adjacent breaker slot. The auxiliary shell includes a controllable actuator that mechanically opens the main breaker.

19 Claims, 4 Drawing Sheets

(56) References Cited

U.S. PATENT DOCUMENTS

| | | | | |
|---|---|---|---|---|
| 2013/0329331 A1* | 12/2013 | Erger | ............. | H01H 9/168 |
| | | | | 361/102 |
| 2020/0251297 A1* | 8/2020 | Lagree | ............. | H02G 5/08 |
| 2021/0126454 A1 | 4/2021 | Upreti | | |
| 2022/0352722 A1* | 11/2022 | Narla | ............. | H02J 3/32 |
| 2023/0069377 A1 | 3/2023 | Hammill | | |

* cited by examiner

SMART GRID INTERFACE RELAY AND BREAKER

CROSS REFERENCE TO OTHER APPLICATIONS

This application is a continuation of U.S. patent application Ser. No. 18/085,947, entitled SMART GRID INTERFACE RELAY AND BREAKER filed Dec. 21, 2022 which is incorporated herein by reference for all purposes, which claims priority to U.S. Provisional Patent Application No. 63/293,014 entitled SMART GRID INTERFACE RELAY AND BREAKER filed Dec. 22, 2021 which is incorporated herein by reference for all purposes.

BACKGROUND OF THE INVENTION

Any backup power source, be it a generator or a solar battery, requires a way to isolate from the grid. For solar battery systems, existing mechanisms for implementing such isolation can be labor and time intensive to install, requiring a significant amount of electrical work. It would be beneficial to have a way to more efficiently implement grid isolation mechanisms.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
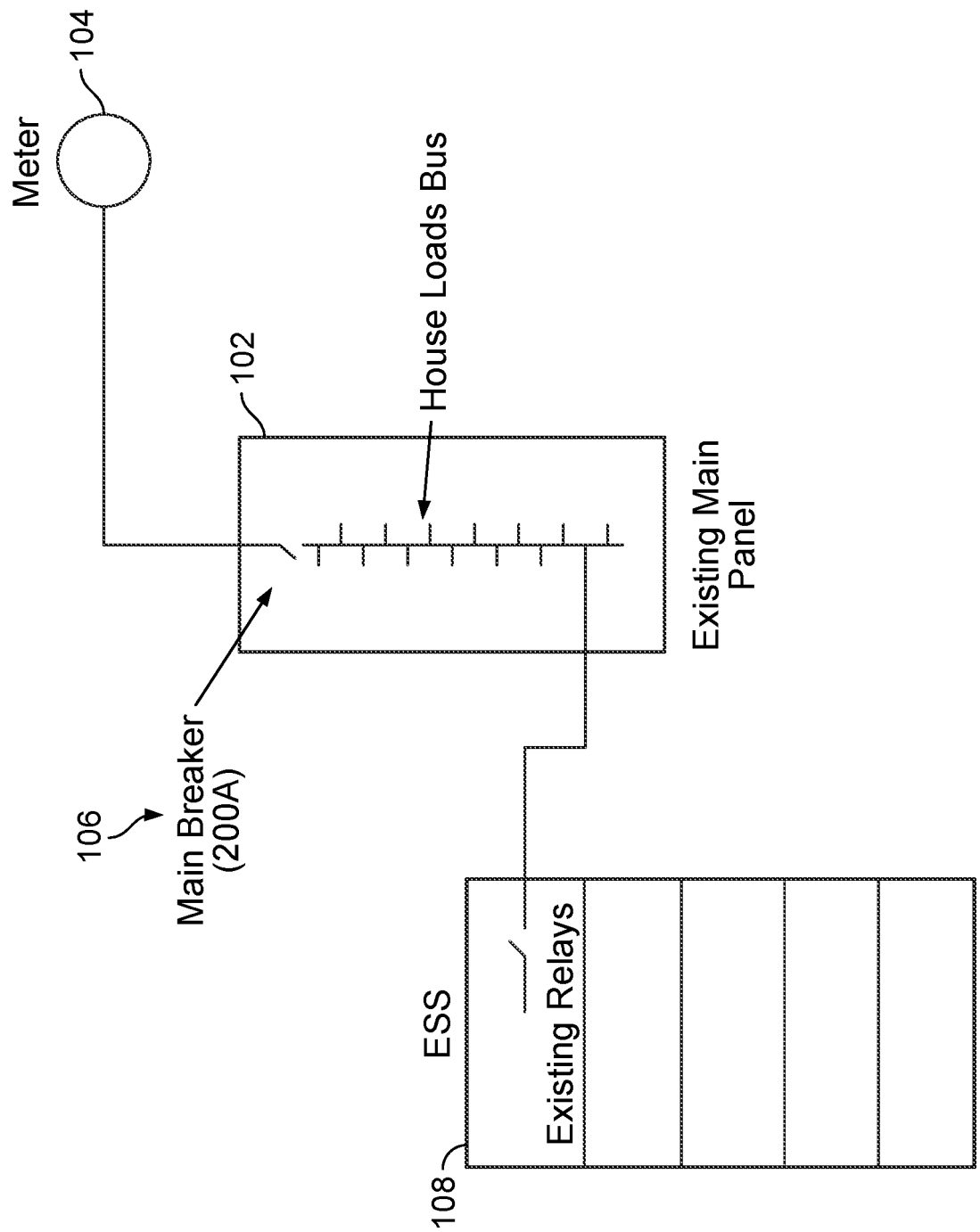
FIG. 1 illustrates an embodiment of a power system.

FIG. 1 illustrates an embodiment of a power system. In this example, the main panel (102) distributes electricity from a main feed (e.g., from the meter 104) to all of the different circuits of a location such as a home. In this example, grid power comes from the meter. The main panel may include a main circuit breaker 106 (also referred to herein as a "main breaker") that disconnects the utility feed from the loads in the house in the event of a thermal fault, high current due to short circuit, etc.

In this example, the power system includes an energy storage system (ESS) 108. As one example, the energy storage system is a battery storage that is part of an on-site solar-battery power system. In this example, the ESS connects through one of the branch circuits of the main panel in the house. For example, suppose there are 24 circuits in the house, where one goes to a dryer, one goes to a hot water heater, one goes to the living room, one goes to an upstairs bedroom, etc. In this example, one of the circuits goes to the ESS. As one example, the ESS is a part of an onsite power system, such as an onsite solar battery system, that includes a photovoltaic (PV) array that generates solar power, as well as an onsite battery storage system that is coupled to the PV array. In some embodiments, the onsite power system includes an inverter. The inverter converts DC power from the PV array and/or batteries to AC power that can be used to power the loads of the home, such as in conjunction with the grid, or when the home is isolated from the grid (e.g., due to a utility grid blackout).

In this example, the ESS, loads, meter, etc. are electrically connected via the bus of the main panel. Thus, if the grid is disconnected by opening the main breaker, then if the ESS is able to provide voltage/power through its connection to the bus, then the ESS can provide power to the entire home, instead of the grid (i.e., forming a microgrid in which the home site is isolated from the utility grid).

In existing power systems, when the utility grid goes down, the voltage on the grid drops to zero, causing the house to black out, as the home's voltage is also brought to zero. In order to bring the home back, the home should be disconnected from the failed grid so that the ESS can now supply power to the home. In some cases, this is a certification requirement for backup power sources to be isolated from the grid when supplying backup power.

It would be beneficial if, in the event of a grid failure, or in the event of a predicted or anticipated grid failure, or it is detected that the health of the grid is declining, that the home could be quickly disconnected from the grid to allow for operating in a backup power mode (e.g., where the ESS is the power source). In some embodiments, if this disconnect occurs sufficiently quickly (e.g., several 60 Hz cycles), then the operation of digital electronics within the home will not be interrupted. This would also be beneficial in the absence of grid failures, for example when there may be financial benefits to isolating from the grid.

One example of implementing a grid disconnect is to include a controllable relay in series with the main breaker. For example, a relay is inserted between the meter and the panel. The entire home may then be disconnected from the grid by opening the relay, allowing the whole home to be powered from the connected ESS.

In some cases, the meter is in the main panel, and the two are unable to be separated. In some embodiments, to address this, another panel is installed, where existing circuit breakers are moved from their original panel to the new panel. The new panel is then fed from the old panel, where a relay such as that described above is installed between the two panels. As one example, the new panel (also referred to herein as a "grid interface panel") includes an integrated relay. In this case, while the loads are still moved from an existing panel to a new one at the time of installation, a separate relay need not be installed between the old panel and in the new panel (as it is integrated in the new panel).

There are various challenges with the installation of the new panel boxes described above. One example is the long installation time required to install such boxes. Another issue is load relocation. For example, one installation scenario involves relocating circuits that are in a home's existing main panel, for example by installing a bridge box as a sub-panel, and then rewiring all of the circuits from the existing main panel to the sub-panel. Even installation scenarios that do not involve load relocation can be time consuming. For example, at a minimum, multiple large gauge conductors would still need to be routed into and out of the newly installed box, which is time-consuming and expensive.

An alternative embodiment for providing a controllable grid interface mechanism is to replace an existing main breaker with what is referred to herein as an intelligent, or smart, main breaker, where the smart main breaker described herein provides not only the safety functionality of main breakers, but also provides controllable actuation of the main breaker, so that it can effectively operate as a controllable grid interconnect switch as well (e.g., to isolate from, or reconnect to the grid as desired). Further embodiments of a smart main breaker are described below.

Described herein are embodiments of a smart main breaker that, in addition to performing the function of a breaker for safety, also provides the function of a microgrid interconnect device. Further, the integrated smart main breaker is packaged in a form factor that is designed to be plugged into the same location as a home's existing main breaker.

As will be described herein, the integrated device provides multiple functions in a single package. For example, the integrated device includes breaker functionality to serve the function of overcurrent and thermal safety protection— that is, it provides a safety mechanism for interrupting current in an overcurrent situation. The integrated device is also controllable, allowing actuation of the breaker to disconnect the home site from the grid in scenarios such as brownouts or blackouts.

As will also be described in further detail below, the integrated smart main breaker device is programmed so that it can autonomously make decisions on when to close or open the main breaker to connect or disconnect the home from the grid. The intelligent main breaker also includes communications to allow coordination with a power source device (e.g., inverter of a home solar battery system).

As will be described in further detail below, the form factor of the controllable main breaker device is selected so that it can be packaged into existing panels, avoiding the need (and associated time and expense) to install a new panel and perform relocating of loads.

Embodiments of the smart main breaker device described herein address the aforementioned issues with existing implementations of microgrid interconnect devices. For example, using the smart grid interconnect breaker described herein eliminates the need for installing a new box. Instead, an existing box/panel is utilized. This provides various benefits. For example, installation time is reduced, where this reduction in overhead would allow an electrician to perform more installations in a day.

For example, in some embodiments, an existing main breaker is replaced with the controllable main breaker described herein that not only serves the safety purpose of a breaker, but is also controllable so that the circuit can be opened when desired (and not just when there is a fault). The controllable grid interface breaker mechanisms described herein provide various benefits, including simplified installation, as well as simplified manufacturing and certification.

Further, combining the microgrid interconnect functionality within a main breaker avoids placing the grid interconnect device in other components such as meters, which would involve certification with utilities. As another example benefit, the use of such an intelligent main breaker does not require coordination with a utility.

The following are embodiments of an intelligent main breaker that also provides integrated microgrid interconnect functionality. As will be described in further detail below, the intelligent main breaker provides safety functionality (via the main breaker and overcurrent and thermal triggers), as well as microgrid interconnect functionality (e.g., by intelligent and controllable triggering of the opening and closing of the main breaker).

In the following examples, existing main breakers are replaced with a controllable main breaker, or are augmented or otherwise adapted to become controllable to also function as a controllable grid interface relay. In some embodiments, existing breaker functionality is leveraged to connect or disconnect from the meter. The mechanisms described herein provide existing breaker safety functionality, while adding (remote) controllability of the breaker mechanism to allow smart connect/disconnect from the grid. For example, the controllable breakers described herein may be opened very quickly, as well as be closed, while still serving the purpose of a breaker to provide critical safety functions. In some embodiments, the controllable breakers described herein, in addition to providing safety functionality, are also actuatable to function as a controllable relay. Thus, in various embodiments, the controllable grid interface breakers described herein may be used as a home disconnect relay (e.g., for backup purposes).

Smart Main Breaker Architecture

Figure 2:
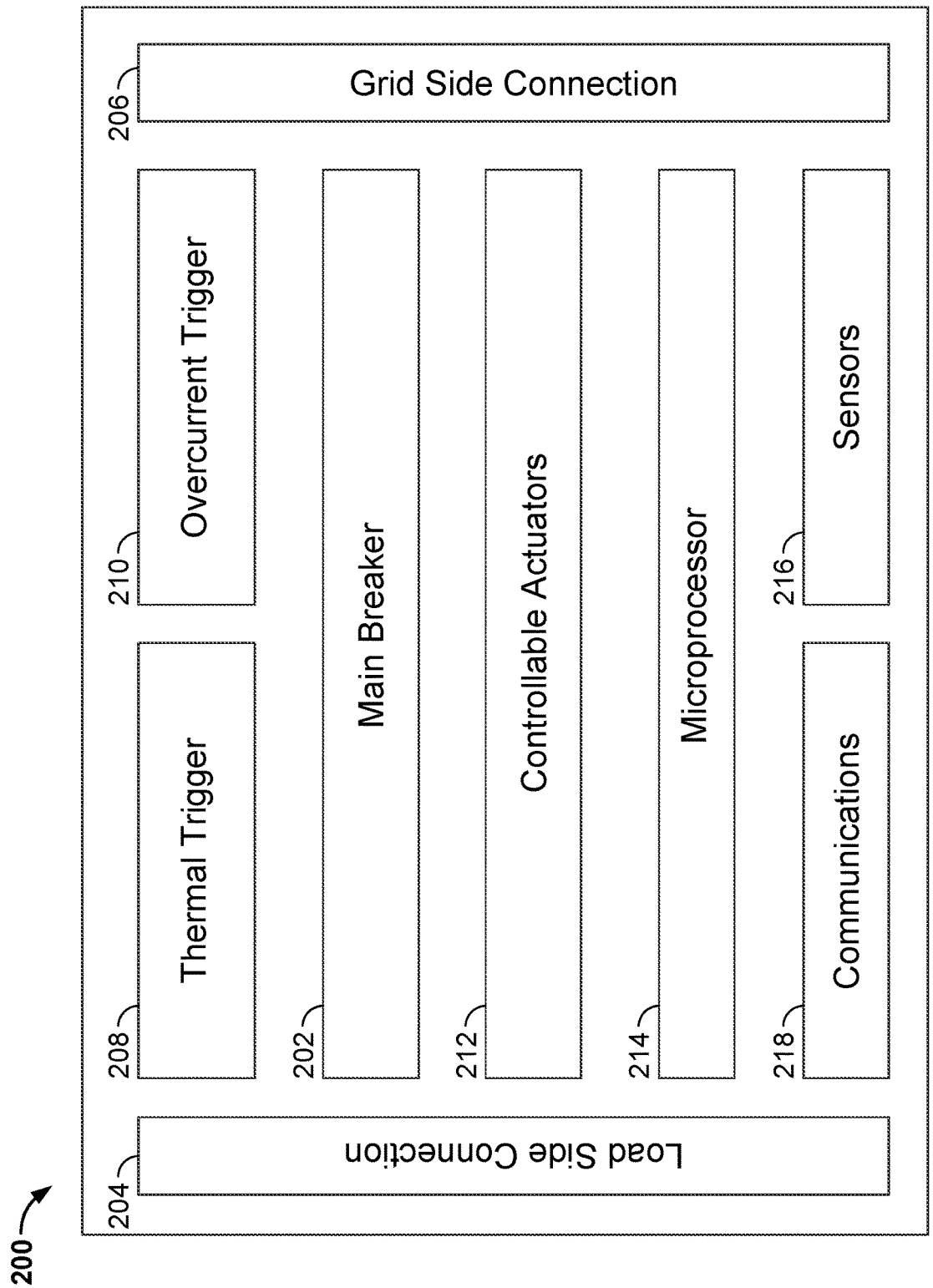
FIG. 2 illustrates an embodiment of an architecture of a smart main breaker.

FIG. 2 illustrates an embodiment of an architecture of a smart main breaker.

As shown in this example, the intelligent main breaker 200 includes a main breaker 202. The main breaker is configured to perform the safety feature of providing thermal or overcurrent protection. The breaker provides a way to disconnect the home from the grid in case of safety issues. For example, when the main breaker is opened, the load side connection 204 (e.g., to home loads) and grid side connection 206 (e.g., to the meter/grid) are electrically disconnected from each other. When it is safe again, a user can reset the main breaker, and reconnect the home to the grid. In effect, main breakers provide a way where the home can be disconnected and reconnected to the grid.

In some embodiments, the smart main breaker leverages the main breaker mechanism to perform the function of a controllable interconnect switch by providing a controllable actuator that can open and close the breaker as desired (rather than only due to unsafe conditions), where the controllable actuator is controlled via intelligence local to the smart main breaker, and can disconnect or reconnect the grid side from the load side (e.g., home). That is, the resettable main breaker is leveraged to also provide intelligent grid interconnect functionality, where a controllable actuator is included in the smart main breaker so that the main breaker can also be used as a grid interconnect switch.

The following are further embodiments of an architecture of a smart main breaker.

Main Breaker/Safety Functionality Triggers

In some embodiments, to provide existing safety functionality, the smart main breaker architecture includes components such as contacts that may be opened and closed (e.g., to break or close a circuit). In some embodiments, the smart main breaker includes a spring-loaded mechanism that snaps the contacts open when triggered. The opening of the contacts may be triggered in a variety of ways. For example, for thermal safety purposes, the smart main breaker includes a bimetal strip 208 that warps when heated, causing the trigger mechanism to be actuated when the current is too high for too long (e.g., thermal tripping). In this example, the smart main breaker may also include, for overcurrent safety protection, a coil/solenoid mechanism 210, where the current flowing through the coil provides a linear magnetic force on an actuator. When there is a high current through the breaker, the magnetic force increases and triggers the actuator, causing the contacts to quickly open. The smart main breaker may also include arc extinguishing mechanisms (e.g., arc shoots or channels such as metal fins).

Controllable Actuators for Opening and Closing the Main Breaker

In some embodiments, to provide remote control functionality, the smart main breaker includes controllable mechanisms/actuators 212 for opening and closing the main breaker. For example, for opening the main breaker, the smart main breaker includes an additional actuator/trigger that is electronically controllable for tripping the breaker on demand. As one example, the additional actuator is a coil/solenoid mechanism that is electronically controllable (rather than, for example, being driven by the primary breaker current). In some embodiments, the solenoid takes power from the voltage on the lines, and when disconnection from the grid is desired, voltage is placed on the coil, which, for example, pushes another coil that pushes the trigger, causing the breaker to open whenever desired. As shown in this example, in addition to two trigger mechanisms for safety, such as the warping bimetal strip for thermal triggering, and a solenoid/coil for high current triggering, the controllable breaker described herein includes an additional trigger mechanism for controlling opening of the main grid interface breaker (to effectively disconnect from the grid). In some embodiments, the additional controllable trigger actuates in response to a command from a microcontroller of the smart main breaker, further details of which are described below.

Reset Motor

In some embodiments, in order to close the main breaker (e.g., to reconnect the load side and the grid side together), the smart main breaker includes a controllable mechanism such as a controllable motor for closing or resetting the breaker when desired. Electronics for controlling the actuator and the reset mechanism may also be included in the main breaker. For example, a closing motor may be included that, on command, reloads springs for closing the contacts of the controllable breaker. This provides, for example, a controllable spring-loaded triggerable contact that may be opened and closed when desired. In some embodiments, the controllable reset mechanism is controlled by commands from a microcontroller of the smart main breaker, further details of which are described below.

Interlocking Mechanism

In some embodiments the controllable breaker is configured with logic that detects when the breaker is triggered due to detection of a fault (e.g., a thermal fault or short circuit). In some embodiments, if it is detected that the breaker triggered due to a fault, the breaker is prohibited from being remotely closed via remote control. For example, detection of the breaker being triggered due to the bimetal strip or the high current solenoid/coil prevents the motor mechanism from being allowed to run or operate. This satisfies any requirement for a manual reset in the event of the breaker opening due to a short circuit or thermal fault. For example, the remote control of the motor is disabled until a user manually resets the tripped breaker.

The following are examples of interlocking mechanisms. In some embodiments, an interlock mechanism is used to interlock the motor in the event that a fault occurs (e.g., thermal fault or short circuit), as described above. In some embodiments, the interlock is a mechanical interlock. In other embodiments, the interlock is an electronic interlock. The interlock may also be an electromechanical interlock.

As one example of a mechanical interlock, the triggers that actuate due to faults (e.g., bimetal strip or high current solenoid/coil described above) are mechanically set up such that if any of those triggers, this also causes the movement of a contact that opens the circuit of the motor (e.g., at the terminals), preventing the motor from operating or running. The interlock mechanism may then be reset when the user resets the breaker mechanism.

As one example of electronic interlocking, in some embodiments, sensors are placed on the triggers that actuate due to faults (e.g., bimetal strip or high current solenoid/coil described above). When any of those are actuated, this also causes the motor circuit to be opened to prevent the motor from being able to run.

In some embodiments, the breaker does not have a switch. While existing breakers may have a physical input such as a button or lever for the user to actuate, the controllable replacement breaker need not have the same shape or type of existing lever. For example, the controllable breaker need not have a lever. As one example, the controllable breaker may have an indicator such as a status light (e.g., red and green status indicator lights), as well as a reset button (where the reset input need not be a lever even if the existing breaker being replaced included a lever). In some embodiments, when the user presses the reset button, this causes the motor mechanism described above to be automatically used to drive the reset mechanism, resetting the breaker. In other embodiments, the reset switch physically causes resetting.

As shown in the above example, even though the existing breaker being replaced may have had a lever, the intelligent main breaker described herein need not have the identical or same type of lever. If the smart main breaker is being implemented in a modular manner (as will be described in further detail below), where there is a standardized core component of a modular controllable breaker, then this standardized core component need not have the identical or same lever. This allows further standardization of the core component so that there need not be core components for different types of levers, switches, reset buttons, lights, indicators, etc.

In some embodiments, the breaker components are designed for robustness to allow a high cycle life, as the breaker may be opened many times and have higher cycle time requirements than typical breakers.

Microprocessor Intelligence for Controlling the Controllable Actuator

As described above, the smart main breaker includes a controllable actuator for opening or closing the main breaker to provide grid interconnect functionality. The inclusion of an additional controllable actuator (e.g., controllable actuators for opening and closing the main breaker) allows the safety function of the main breaker to be maintained, while also providing the ability to control connection to/disconnection from the grid. In some embodiments, the smart main breaker includes a microprocessor 214. In some embodiments, the microcontroller is a programmable microcontroller on which intelligence and algorithms can be deployed on (e.g., by programming firmware of the programmable microcontroller). Further details regarding such functionality are described below.

In some embodiments, the microprocessor or microcontroller provides onboard intelligence. The onboard intelligence is used to, for example, allow the device to autonomously determine when to turn on or off the connection to the grid (e.g., by sending instructions or commands to the controllable actuators 212 to open or close the main breaker), as well as other functionality. In some embodiments, by making intelligent decisions on disconnecting from, or reconnecting to the grid, this ensures seamless power transitions for the homeowner, minimal numbers of transitions, as well as adherence to any present or future certification requirements for smart inverters, grid connected devices, backup power sources, and/or microgrid interconnect devices.

In some embodiments, the microprocessor includes I/O that is connected, for example, to sensors 216, communications 218, etc. The microprocessor also includes I/O to communicate internally with the controllable actuators 212 for opening and closing the main breaker 202. This provides an interface by which the microprocessor can command the controllable actuator to open or close the main breaker to effect grid disconnect or reconnect. The microprocessor also communicates with the communications module 218 so that it can receive information from, and send information to, external devices.

In various embodiments, the smart main breaker is powered by the onsite power system and/or the grid. In some embodiments, the smart main breaker includes a battery. In some embodiments, the battery is included to operate the switch when both grid power and backup power are unavailable. As shown in this example, the smart main breaker device may be designed with multiple sources of input power, such as grid side, load side, hardwired, and battery, etc. in order to remain operational in the maximum number of outage conditions.

Sensors

In this example, the smart main breaker includes sensors 216 for sensing electrical characteristics such as voltage, current, phase, amplitude, frequency, etc. In some embodiments, the sensors are used to measure both grid side and load side (e.g., home side) electrical characteristics.

Communications

In this example, the device includes communications module 218 for communicating with devices external to the device. Examples of communications interfaces include CAN (controller area network) communications, powerline communications (PLC), WiFi, ethernet, or any other wired and/or wireless communications as appropriate. As one example, a communications protocol such as RS485 is used.

As shown above, in some embodiments, the smart main breaker includes electronics for controlling the triggering (e.g., opening) of the contacts in the breaker, as well as closing/resetting of the breaker. In some embodiments, the controllable actuator is implemented using a controllable solenoid that is connected via wires to the microprocessor. In some embodiments, the microcontroller then puts voltage on the wires to trigger the actuating mechanisms described above. For example, the controllable breaker includes the additional trigger mechanism, motor (e.g., for resetting the breaker after it is opened), an interlocking mechanism as described above, a mechanism for resetting the interlock, as well as other associated electronics.

As described above, in some embodiments, the smart main breaker also includes additional processing logic, communications (e.g., powerline communications, WiFi componentry, etc.), etc. In some embodiments, the mechanisms for controlling the opening/closing of the breaker as a relay are designed to not interfere with the safety functioning of the breaker (e.g., so that the breaker can still open in the event of thermal faults or short circuits).

As also described above, in some embodiments, the smart main breaker includes a motor reset mechanism. In some embodiments, the smart main breaker includes a third or additional controllable trigger mechanism (e.g., solenoid), as described above. As one example, the controllable trigger mechanism may act, for example, as a type of push button that behaves as a manual trip. As one example, the replacement breaker includes a button that may be toggled or actuated, such as a push button. A controllable solenoid and motor accessory may then be placed over the button. The controllable motor accessory may then actuate the button on the smart main breaker. Such an implementation may be used in space constrained scenarios. For example, suppose that a manual shutoff button was included in the replacement breaker, but there is not sufficient space to include a solenoid that could actuate the button. In some embodiments, the solenoid is placed externally, and is configured to push that button. Similarly with the motor, if there is insufficient space within the breaker that goes in the slot, a user input or control that a user may toggle or actuate may be included in the breaker that fits within the slot, where the breaker component is augmented with an external motor accessory that actuates the control (e.g., physical button or lever).

Smart Main Breaker Intelligence

As described above, the intelligent main breaker includes a microprocessor and a controllable actuator for opening and closing the main breaker (e.g., solenoid for opening the main breaker, and a motor for resetting the main breaker, as described above). In some embodiments, the microprocessor is programmable with a layer of firmware.

In some embodiments, the microprocessor is configured with logic to determine when to connect to the grid, and when to disconnect from the grid (e.g., isolate the home from the grid). Based on this intelligence, the microprocessor then issues commands to the controllable actuator to open/close the main breaker to cause the disconnection from/reconnection to the grid.

For example, the integrated smart main breaker device is programmed with functionality to open due to a brownout or when the grid is down so that the solar battery system can isolate from the grid and allow the microgrid at the home to be stood up.

The decision making on how to control opening and closing of the grid interconnect switch is based on a variety of inputs including, without limitation:

Sensor measurements (e.g., from sensors 216): such as measurements that indicate that the grid is going down Messages: This includes messages communicated from partner devices. For example, an energy management system for the home battery system may send a message indicating that it would like to form a microgrid, and make a request to the integrated breaker and grid interconnect device to open the grid interconnect switch.

The following are examples of intelligent functionality supported by the intelligent main breaker described herein.

The use of backup devices such as generators often involve transfer switches, because the generators are not to be operated in parallel with the grid, and so the transfer switch determines one power source or the other, but does not allow a connection to both simultaneously. This is in contrast to solar battery systems such as that described herein, which operate both on-grid and off-grid. For example, the intelligent main breaker is configured to enable a power source such as the inverter to be connected in both scenarios. In some embodiments, the intelligent main breaker and onsite power source (e.g., inverter) are configured to communicate with each other. This allows, for example, status information to be passed between the inverter and the integrated breaker/interconnect. The passing of status information allows the integrated breaker interconnect device to make appropriate decisions and not enter an improper state.

As one example, suppose that the inverter (example of an onsite power source) is not operational (e.g., because somebody has manually opened an inverter relay). Now suppose that a brownout has occurred. In this case, because the inverter is down, the integrated device should not open, and should stay connected to the grid. This is so that the home will have power as soon as the grid returns. As the inverter is not operational, it would not be beneficial to disconnect from the grid and island or isolate the home from the grid (as there would be no power source to form a microgrid). In some embodiments, the intelligent main breaker uses status information of the inverter as an input to determine whether to open its switch.

As another example, suppose that the inverter was operational, and that during a brownout, the smart main breaker device had opened, isolating the home from the grid, where the inverter was the sole power source for the home.

Now suppose that the grid is back up (which the intelligent main breaker device determines based on electrical measurements of the grid-side using its sensors). The intelligent main breaker should reconnect the home to the grid in this case. This would also cause the inverter (which may be delivering power) to also be connected to the grid. However, the reconnection should not occur until the inverter is synchronized with the grid (so that the inverter is in grid following mode, where the electrical characteristics of the inverter's power output follow the grid). For example, the grid and inverter power source should align in phase, amplitude, and frequency before reconnection to the grid is performed.

In some embodiments, prior to closing of the main breaker of the smart main breaker, the microprocessor is configured to determine characteristics of the grid for synchronization with the onsite power source. This includes measuring phase, amplitude, and frequency of the grid. The smart main breaker then uses its communications module to communicate the measured grid electrical characteristics to the inverter. The inverter then uses the grid characteristic information to adjust its output to match the grid side characteristics. In this example, the smart main breaker measures the power provided by the inverter on one side, and the characteristics of the power from the grid side and the load side. When the smart main breaker determines that both sides are synchronized, the microprocessor instructs the controllable motor to close the main breaker so that the home and the grid are reconnected.

As shown in the examples described herein, the onsite power source can operate as grid following or grid forming. When the home is on grid, the power source is to operate in a grid following mode. When the home is off-grid, the power source is to operate in a grid forming mode (e.g., where the home is isolated from the grid, and the home is in an effective island or microgrid state in which the onsite power source is delivering power to the loads at the site).

As shown in the above examples, in order to determine when it is appropriate for the onsite power source to enter one mode or the other, communication and coordination with the intelligent main breaker is performed so that status information can be passed between the interconnect device and the inverter onsite power source. The following are further embodiments and examples of such coordination.

When the main breaker is open and the onsite power system is disconnected from the grid, then the onsite power system should be in a state where it is capable of forming a microgrid and providing power to the loads of the home. As one example, the inverter is programmed to enter grid-forming mode on the condition that the home is disconnected from the grid. Thus, before switching to grid-forming mode, the inverter checks for the status of the interconnect switch to determine if it is opened or closed. If the smart main breaker/grid interconnect switch is closed, then the inverter is not permitted to enter grid-forming mode.

As another example, before the inverter switches state to grid-following mode, the inverter checks with the smart main breaker to determine whether the grid is back up. If so, then the inverter switches to grid-following mode, and also coordinates resynchronization with the grid as described above using, for example, information collected and communicated by the intelligent main breaker device. As shown in this example, in some embodiments, when the main breaker is closed and the onsite power system is connected to the grid, then the onsite power system is to operate in a grid following mode, and the onsite power waveform and the grid power waveform should be synchronized.

As shown in the above examples, the smart main breaker for solar and battery systems described herein facilitates communication between the grid interconnect device and the inverter.

As described above, in some embodiments, the intelligent and controllable main breaker device includes a microprocessor so that it has local autonomy to determine what actions to take. It also includes communications to allow communication with external intelligent devices (e.g., on site power source), so that information from external devices may also be used as input for the microprocessor. In this way, appropriate actions will only be taken when there are correct signals from both devices, such that they are coordinated. However, if there are some issues with the communication, then the smart main breaker uses its included intelligence so that it can enact secondary or fallback or primary directive plans to perform safe actions in the event of it being unable to communicate with the inverter.

As shown in the examples above, in some embodiments, the inverter of the ESS is configured to switch between two operating modes: grid-following mode (when the home is on-grid), and grid-forming mode (when the home is off-grid). The smart main breaker is configured to determine whether to open or close the main breaker (effectively disconnecting or connecting the home from/to the grid). In some embodiments, the state of the inverter (e.g., which operating mode it is in), and the state of the smart main breaker (e.g., whether the main breaker is opened or closed) are based on coordination between the inverter and the smart main breaker. That is, the state of the inverter is based on the state of the smart main breaker, and vice versa. The behavior of the inverter and the smart main breaker is also dependent on a variety of factors that are context specific.

The following are further embodiments of intelligently determining whether to open or close the main breaker of the smart main breaker described herein. In some embodiments, the logic for such a determination is implemented in firmware and executed by the microprocessor of the intelligent main breaker.

Embodiments of Disconnecting a Site from the Grid

In some embodiments, the smart main breaker includes logic for determining the conditions under which disconnect from the grid is permitted (and also the conditions under which the smart main breaker is prohibited from disconnecting from the grid.

As one example, suppose that the home is currently connected to the grid. However, the smart main breaker determines, based on its sensors, that the voltage on the grid is beginning to sag. This is an indication to the smart main breaker that the grid may be going down. In this case, the smart main breaker prepares to disconnect from the grid.

Prior to opening the main breaker, the smart main breaker is configured to determine a state of the onsite inverter power source. In this example, the smart main breaker first checks to determine whether the inverter is capable of handling the home loads. For example, if the inverter is not capable of handling the home loads, then the smart main breaker does not disconnect the home from the grid, as this may cause the inverter to fault or trigger its own relay if it is unable to support the loads in the home.

As another example, suppose that the inverter is not available at all (and is non-operational). In this example, it would be a poor user experience for the customer if the home were disconnected from the grid, as they will then go from a brownout situation to a blackout situation (because the inverter cannot be a power source at all). As such, in some embodiments, the microprocessor of the smart main breaker is programmed such that even if it is determined that there is an indication that the grid is going down (and would be unable to deliver electricity), it does not disconnect from the grid if the inverter power source is determined to be unavailable or incapable of powering the home loads.

As shown in the above examples, prior to taking the action of opening the main breaker and disconnecting the home from the grid, the smart main breaker determines whether the onsite power system is in a condition or state to form a microgrid (e.g., is operational, is able to provide sufficient power for the loads of the home, etc.). If so, then the smart main breaker opens the interconnect grid switch, disconnecting the site from the grid.

The above are examples of coordination between the smart main breaker and a solar battery system that allows the smart main breaker to determine whether or not to disconnect from the grid.

Embodiments of Reconnecting a Site to the Grid

Coordination between the smart main breaker and the solar battery system is also performed by the smart main breaker to determine whether or not to close the main breaker and reconnect to the grid. For example, if the grid comes back after a blackout, it is often the case that the grid will reach a nominal voltage, and will then sag again, before coming back. If the smart main breaker were to reconnect once the nominal voltage was reached, and then disconnect once the sagging was detected, and then reconnect once again when the nominal voltage was again reached, it would result in a less than ideal user experience, as the smart main breaker would be quickly toggling back and forth between reconnecting and disconnecting and then reconnecting again to the grid due to the fluctuation in voltage triggering opening/closing of the main breaker. In some embodiments, debounce or hysteresis is accounted for.

As another example, suppose that the grid voltage is just at the threshold of the cutoff of when the smart main breaker would disconnect from the grid. That is, the voltage is at a level where it may be appropriate to disconnect from the grid. However, if the voltage is hovering around that level, it would not be ideal for the smart main breaker to connect and then disconnect and then reconnect. Instead, the reconnection logic is configured to be hysteretic.

In some embodiments, hysteresis (where the thresholds or conditions for opening/closing the main breaker are different) is implemented by having different sets of detected grid conditions for connecting to and disconnecting from the grid. For example, there are different thresholds or criteria for opening and closing the grid interconnect switch.

In some embodiments, the thresholds are coordinated with the inverter, so that the smart main breaker is aware of the inverter state.

As one example, if the PV array is producing a large amount of power, and the batteries are full, then the dead band (between the threshold for opening/closing the main breaker, where the state of the main breaker (opened or closed) is not changed while in the dead band) can be broad or large. As the state of the microgrid is strong and can support the home loads stably for a duration of time, there is less urgency to reconnect to the grid, and the threshold level of grid stability before reconnection can be set higher given this inverter state (e.g., wait for the grid to be more stable before reconnection).

On the other hand, if the onsite power system will only be able to further support the home for a short amount of time, then the dead band is shrunk, and reconnection to the grid may be performed even pre-emptively so that the home does not enter a state in which it is both disconnected form the grid, and the onsite power system is not operational. For example, if the onsite system is still up, but is close to becoming non-operational, then the system is pre-emptively reconnected to the grid (so that the smart main breaker does not enter into a situation where it does not have enough power to close the main breaker, which could result in the home being unable to be connected to the grid after the grid has come back).

As shown in the above examples, in some embodiments, to account for such fluctuation in voltage, the smart main breaker is configured with intelligence to determine the set of conditions by which the home should continue to be islanded until the smart main breaker is confident that the grid is actually back.

The following are additional conditions or criteria for determining whether to reconnect to the grid:

The amount of reserve battery capacity

Whether the sun is shining (and solar power is being generated by the solar panels)

The power capacity of the inverter

In some embodiments, loads are supported for as long as they can, and the smart main breaker waits until the grid voltage is back closer to nominal in order to reconnect.

In some embodiments, resynchronization is performed as part of the reconnection process. For example, suppose that the grid is determined to be stable and that the onsite power system is also determined to be stable.

In some embodiments, the smart main breaker uses its sensors to measure the electrical characteristics of the grid. The smart main breaker uses the grid electrical measurements to determine that the grid is in a stable condition.

With respect to onsite power stability, in some embodiments, the smart main breaker uses its sensors for measuring the onsite power side, and the microprocessor (which is connected to the sensors via input/output (I/O)) uses the onsite power measurements to determine whether the onsite power system is stable. As another example, the smart main breaker receives status information from the ESS indicating its stability. For example, the smart main breaker queries the onsite power system for its stability status. As another example, the ESS periodically reports or provides such information to the smart main breaker.

In order for the onsite power system and the grid to be reconnected, they are required to be synchronized, where the frequency, phase, and amplitude of their voltage must be within a certain tolerance of each other (that may be defined by a standard). At the point of reconnection, they may not be, and it would be unsafe to reconnect the onsite power system and the grid before resynchronization, as it would force onsite power production to stop. In some embodiments, as part of the reconnection process, before the main breaker of the smart main breaker is closed, the smart main breaker is programmed to transmit a signal or message to the inverter or ESS to start changing its power output to match the electrical characteristics of the grid. As one example, the smart main breaker uses its sensors to measure the electrical characteristics of the grid, and provides that sensor data to the ESS. The ESS then uses that information to adjust its output waveform and bring it closer to the grid waveform until they are in sync. Once the grid and ESS waveforms are determined to be in sync, then the action of closing the main breaker to reconnect the grid to the onsite power system is performed.

In the above examples, the smart main breaker determines to reconnect to the grid based on detection of the grid returning to a stable condition. The smart main breaker may also be programmed to reconnect the home site to the grid under other conditions as well.

As one example, suppose that there has been a blackout, and the home has been disconnected from the grid for a period of time. Suppose also that it has been cloudy, and that there has been minimal solar power produced, where the batteries have been drained. In this situation, there is no power for the inverter to deliver.

In this case, based on the onsite power system being unavailable to provide power (but while there is still sufficient power for the smart main breaker to operate), the smart main breaker is configured to pre-emptively reconnect the home to the grid rather than wait for the inverter to come back. In this way, if the grid comes back online in the middle of the night (when there is no sun), the house will be powered by the grid. This is an example of a dark start condition, and in this example, the determination of the condition on which to reconnect to the grid is based on coordination between the inverter and the smart main breaker.

In some embodiments, while the smart main breaker is in a disconnected state from the grid, the smart main breaker is configured to monitor the health or status of the ESS, such as its state of charge (SOC), the amount of power being produced by the panels, etc. That is, the state of the microgrid is determined. If the microgrid is determined to be unable to support or power the home loads, then the smart main breaker reconnects the home to the grid.

In some embodiments, the onsite power system also includes various intelligence. As one example, the onsite power system is configured with the ability to cause load shedding to reduce the number of loads it needs to support. This can increase the amount of time in which the home can be supported by the onsite power system, and make the onsite power system more stable.

As another example, in some embodiments, prior to shutting down power generation, the onsite power system is configured to transmit a signal to the smart main breaker indicating that it will be going offline. After a timeout period, the smart main breaker will perform reconnection to the grid.

As described above, the smart main breaker may be powered by either the grid (e.g., via the busbar), the inverter (e.g., via the busbar connection, or a hardwired power and communication cable), and/or a battery (e.g., either manufactured directly into the smart main breaker or via a separately packaged battery connected via a dedicated power connection). If the grid is down, and the onsite power system is up, then the smart main breaker is powered by the onsite power system (e.g., by the inverter). In some embodiments, prior to the inverter going offline, and while it has sufficient power, the inverter transmits the signal to the smart main breaker indicating that it will be going offline, and also provides enough reserve power so that the smart main breaker is able to process the message and then close the interconnect switch so that the home is reconnected to the grid. In other embodiments, the smart main breaker includes a battery, and the smart main breaker reconnects to the grid (by powering the motor to close the main breaker) while it has sufficient power to do so.

Commissioning for Smart Main Breaker

The following are embodiments of commissioning of the smart main breaker described herein. In some embodiments, the commissioning process described herein minimizes installation and commissioning steps, even in the face of a varied hardware ecosystem.

Smart main breaker commissioning is the process by which a smart main breaker is installed into a home. This usually occurs at the same time as the installation of the ESS. One goal for this process is to proceed automatically with as little labor as possible.

The smart main breaker microcontroller (e.g., microprocessor described above) may be powered in some or all of the following ways:
1. Powered via a battery that is packaged within the smart main breaker
2. Derive power from the AC voltage applied at the grid side of the smart main breaker (that is being used as an intelligent, controllable grid relay)
3. Derive power from the AC voltage applied to the load side of the smart main breaker
4. Powered via a hardwire from the ESS (which in some embodiments is accompanied by a hardwired comms link, such as CAN or ethernet).

In some embodiments, when a new smart main breaker is installed, it is configured to:
1. Associate with one or more ESS units on site. If communication is wireless, such as over WiFi, it should ensure that it is pairing only with an ESS that is connected to the "Load" side of the relay, and not pair with, for example, an ESS in an adjoining building.

This pairing allows for the relay state (e.g., state of the main breaker) to be reflected, for example, in a smartphone app, measure home consumption data, and other user facing features. This may also include an authentication step.

2. Exchange information with the ESS, which can include a FW (firmware) version, serial number, etc. for serviceability.
3. Boot into an "open" state to ensure that if an ESS is currently connected to the load side, there is not a large inrush current when the device boots.
4. In some embodiments, the smart main breaker is programmed for a configurable amperage rating. In some embodiments, unlike a conventional main breaker, the current rating of the intelligent main breaker (e.g., the trip current) may be configured, as it is defined in firmware. If a particular panel requires a 100 A breaker instead of a 200 A breaker, the same device can be used and configured to trip at an overcurrent condition equivalent to a 100 A breaker.

In some embodiments, to associate the smart main breaker to the ESS, the device first boots into an "open" mode. If hardwired to the ESS, the association is automatic. If wireless, in some embodiments the smart main breaker connects to a wireless network formed by the ESS. After joining the wireless network, the ESS may then enter a "grid forming" mode whereby it powers the loads in the home (while the smart main breaker is still isolating the home from the grid). The smart main breaker can then measure the voltage on the load side of the breaker and report precise measurements of the frequency and voltage to the ESS. In some embodiments, this measurement is used as a form of authentication. If the ESS and smart main breaker agree on the frequency of the AC voltage, then it is certain that they are connected to the same electrical circuit. If they disagree, then in some embodiments, the ESS removes the smart main breaker from the wireless network. If they agree, then the ESS and the smart main breaker are considered "paired". The ESS may vary the frequency or amplitude of the AC voltage to ensure agreement.

An alternative embodiment of performing the above is to rely on PLC (powerline communications), although PLC may require costly electronics, and may be subject to failure in noisy environments.

In some embodiments, after pairing, the smart main breaker then provides phase offset measurements between the measured AC voltage on the grid side and the AC voltage from the inverter. In some embodiments, the smart main breaker provides the phase offset via a message back to the ESS, and the ESS adjusts the phase until they are back in alignment.

Smart Main Breaker Form Factor

As will be shown in the examples below, embodiments of the smart main breaker herein are designed to accommodate existing breaker slots, so that they can be installed into existing breaker panels, with little to no modification of the existing main panels.

As described above, the smart main breaker is designed or sized to fit within an existing panel, and plugs into one or more standard breaker slots of the panel. There is a significant amount of variation in existing main panels that have been installed in homes, with numerous different kinds of makes and models. In order for a main breaker to be used with a main panel, it is often required to be certified to be compatible with that main panel. Typically, the certification of breakers involves panel manufacturers certifying that a given main breaker is compatible with their panel, such that the breaker can be included or listed on their certification directory. In this case, instead of certification with a utility, before being used in a panel, the smart main breaker device described in would have to be certified with OEMs such as breaker OEMs, panel OEMs, etc.

The intelligent main breaker described herein is designed or sized or constructed to be certified to be compatible with a large range of existing main panels. For example, the design of the physical shape or the form factor is determined to have the broadest compatibility with existing panels.

As one example, an evaluation of panel manufacturers and different main breaker SKUs for the manufacturers for different amperage sizes is performed. For the most common form factors, the ones that also share physical shapes are also determined in order to arrive at a single form factor that has the greatest compatibility across panels (e.g., has the highest compatibility, not just for one panel manufacturer, but across multiple panel manufacturers). For example, all of the form factors for main breakers of different main panel brands, models, and amperage sizes are evaluated. The form factor that is both most common and easiest to manufacture is determined.

For example, the most common form factor may not be for the most common panel. As one example, consider larger amperage sizes of 200 A, which is the most common main panel amperage size. Despite such a panel being the most common size, each manufacturer has approached the manufacturing of compatible 200 A breakers in a variety of different shapes. Instead, the most common form factors across all panels include 100 A and 125 A breakers that have conventional form factors of being two pole, one inch per pole, with a standard handle tie. That is, the 100 A to 125 A breaker is the most uniform form factor across panels.

In some embodiments, the form factor of the intelligent main breaker is selected based on this analysis of breaker form factors and the panels that they are compatible with. For example, the most common industry standard form factor across all manufacturers that will fit the most panels is selected as one option for the form factor of the smart main breaker. For example, breakers from 15 A to 125 A across the four major breaker OEMs have form factors that are substantially the same.

The analysis to determine what is the most compatible breaker form factor can be periodically performed over time, in case form factors for breakers shift.

As one example, the smart main breaker is implemented around a design utilizing a one inch per pole, two pole breaker, with a form factor similar to that of a plug-on stab main breaker. In some embodiments, the smart main breaker is a multi-piece assembly, with a core trip assembly, with intelligence wrapped around it in a manner that allows the entire assembly to be fit everywhere that the integrated device is certified.

The following is an example of a package or form factor for the smart main breaker described herein. As described above, in addition to including a main breaker for safety functionality, the smart main breaker includes various other componentry, such as controllable actuators, sensors, microcontroller, memory, communications, etc.

Existing main breakers are typically quite full. Given the additional componentry of the smart main breaker, the smart main breaker will require more space for all of its components than what is typically found in an existing main breaker form factor. In some embodiments, to house all of the componentry of a smart main breaker, the smart main breaker packaging includes a first portion that has the form factor of an existing main breaker, and also includes a second "backpack" container portion, where the "backpack" container portion has the shell and sizing of an existing branch breaker. This allows the overall package to be plugged into the main breaker slot, as well as the adjacent branch breaker slot/spot.

The following are embodiments of a smart main breaker that, while larger than a typical existing main breaker, is still able to be fit or placed into the same location of the existing main breaker being replaced.

For example, the form factor of the smart main breaker allows the smart main breaker to be installed on the bus bar with other branch breakers. The smart main breaker is constructed such that in addition to occupying the same space of a typical main breaker, it also consumes an additional breaker slot. For example, the intelligence is packaged into a container that is constructed to fit into a free breaker slot. In this example, the smart main breaker has a package that takes up a main breaker slot and an adjacent branch breaker slot.

For example, in some embodiments, for the smart main breaker, the selected breaker form factor is duplicated, where some of the components are piggybacked onto the selected breaker form factor in a "backpack" portion.

For example, if a typical hundred-amp breaker is two inches wide, taking up two spaces, then a container is added or attached as part of the overall smart main breaker package that is also an inch wide, with space for the intelligence, communications, etc. This results in a three-inch wide package that takes up three spaces (main breaker slot, which is often two spaces, along with an adjacent branch breaker slot). In this example, the smart main breaker has the form factor of a main breaker with an additional container (aforementioned "backpack") for all of the additional componentry needed to implement the smart main breaker.

Figure 3:
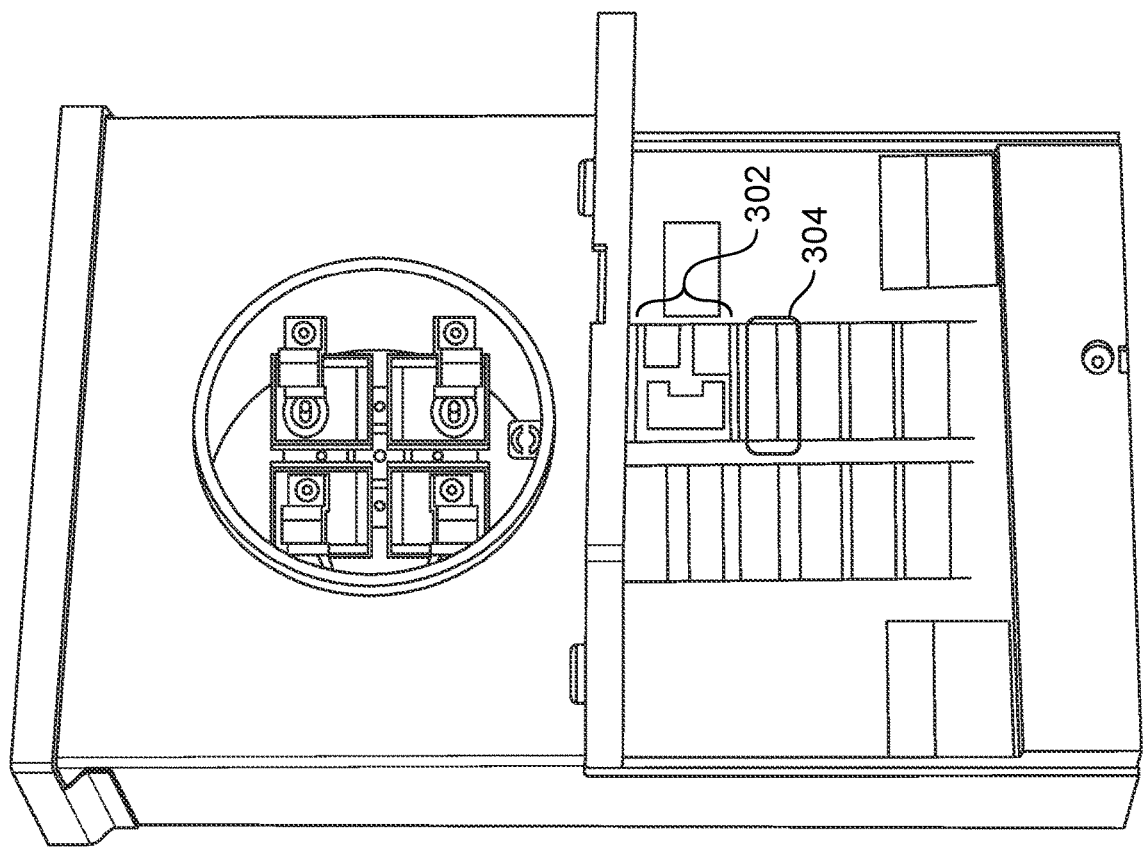
FIG. 3 illustrates an example of a location for installation of a smart main breaker.
Figure 4:
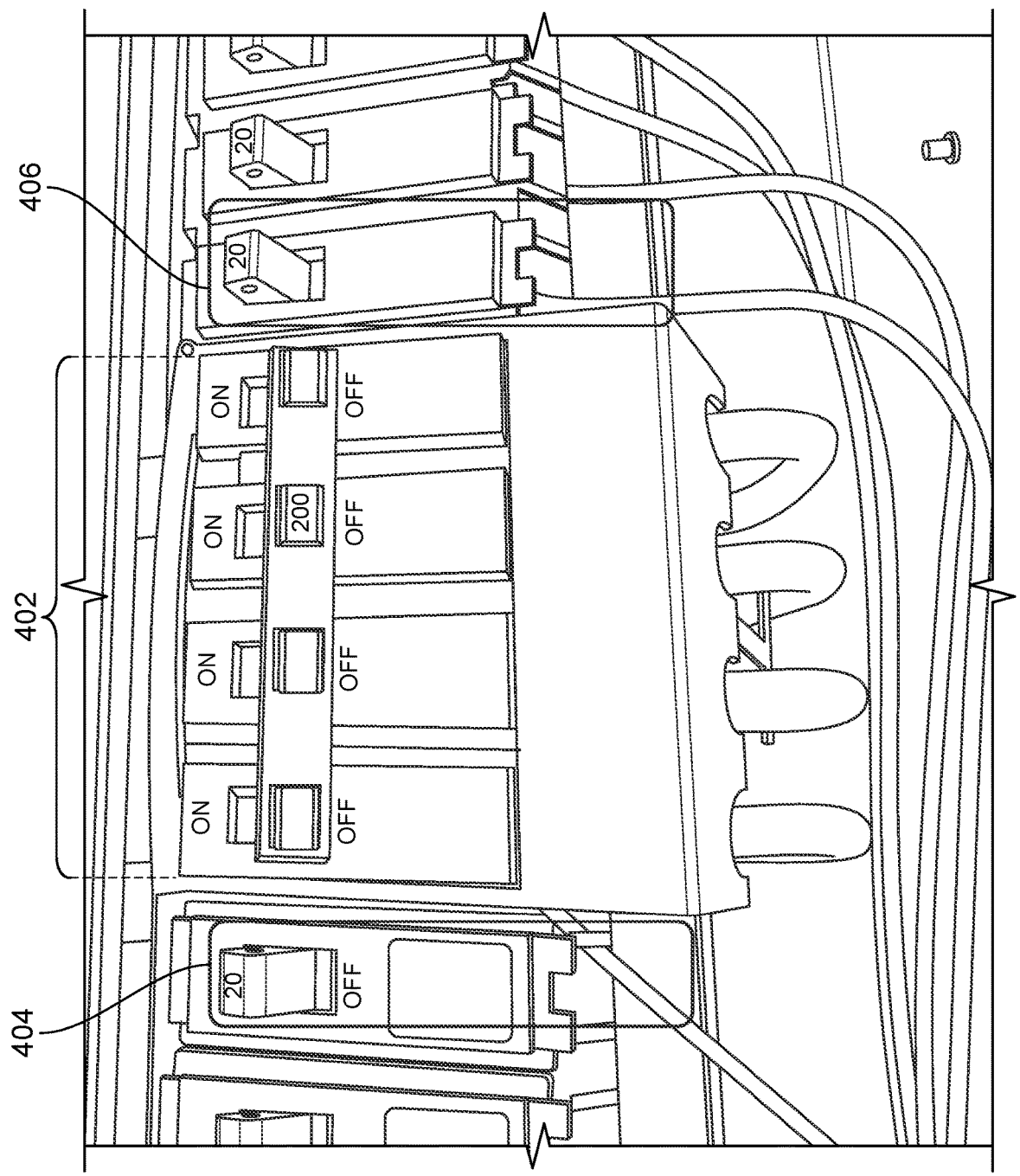
FIG. 4 illustrates an example of a location for installation of a smart main breaker.

FIGS. 3 and 4 illustrate embodiments of locations in an existing panel in which embodiments of the smart main breaker described herein may be installed.

FIG. 3 illustrates an example of a location for installation of a smart main breaker. In this example, the portions of a panel that a smart main breaker slots into are shown. For example, suppose that the smart main breaker has the form factor of a standard hundred-amp main breaker form factor, where the form factor is augmented or piggybacked with a container that has a form factor of another branch breaker so that it occupies both the main breaker slot (302), as well as the branch breaker slot (304) adjacent to the main breaker slot. One example of a 100 A or 125 A version of a smart main breaker takes up the existing two slots in the panel for main breakers, with the piggyback container portion occupying the branch breaker slot adjacent to the main breaker slot.

A typical panel includes a space for a main breaker, as well as spaces for branch breakers. For example, a standard 125-amp breaker takes up two breaker slots/spaces. In some embodiments, the housing of a smart main breaker is constructed to take up the space of an existing main breaker, as well as an adjacent branch breaker space. For example, the package of the smart main breaker is sized to occupy the main breaker slot and an adjacent branch breaker slot. The smart main breaker packaging includes terminals and fasteners to fit into the main breaker slots and adjacent branch breaker slot.

That is, as shown in this example, the smart main breaker is sized to take up the main breaker slot in the panel, as well as consume an adjacent branch breaker slot so that the packaging of the smart main breaker includes sufficient space for all of the componentry to allow the smart main breaker to not only function as a main breaker for safety purposes, but also as a controllable grid interconnect relay, while also being able to plug into the slots of existing panels.

FIG. 4 illustrates an example of a location for installation of a smart main breaker. In this example, installation of a 200 A main breaker is described. As one example, the new smart main breaker plugs into the existing slots 402 allocated for a 200 A main breaker, where additional space for intelligence would be included in portions of the smart main breaker packaging that fit or slot or plug into adjacent branch breaker slots (e.g., one or both of the adjacent branch breaker spaces 404 and 406—the smart main breaker may also be sized so that it occupies other sets of branch breakers adjacent to the main breaker slot). In some embodiments, a 200 A main breaker is implemented by using two 100 A smart breakers.

The example of FIG. 4 shows a customer's existing panels, as wired. At 404 and 406 are examples of branch breakers, such as 20 A branch breakers. The branch breakers 404 and 406 are in the spaces adjacent to the main breaker slot 402. In this example, there is a breaker in each of the adjacent 20 A branch breaker slot. During installation, if that slot is not available, an electrician can free up the adjacent breaker space so that the smart main breaker can consume or occupy the existing main breaker space in the panel, as well as the adjacent branch breaker space that is next to the main breaker slot.

As one example, a larger 150 A or 200 A version of the smart main breaker includes a portion that takes up four breaker spaces, with a two-space piggyback or "backpack". In some embodiments, the smart main breaker is implemented as a one-piece design that includes all of the componentry, and that plugs into the breaker panel (e.g., into the main breaker slots and adjacent branch breaker slots) as a single unit.

In some embodiments, the smart main breaker is implemented as a plug on breaker. The smart main breaker is installed onto the bus bar stabs of the main panel. When installing, the installer wires the grid connection, as well as the communication connection to the intelligent onsite power source.

As described herein, having a smart main breaker that is sized to utilize adjacent breaker slots provides the ability to take an existing form factor and grow it in a dimension that allows the smart main breaker to incorporate the componentry for implementing smart grid interconnect relay functionality, while still being able to be installed in an existing electrical panel.

Modular Intelligent Main Breaker

As one example, the controllable breaker is modular and may be constructed as multiple pieces. One piece for example is a standardized core component. Other pieces include adapters (e.g., cases) attached to the core component to create breakers of varying sizes and shapes to accommodate different types of breaker slots. This allows variable sized controllable main breakers to be created for various types of situations (where breakers may be of various shapes and sizes, with different amperage ratings).

The following is an example of a controllable main breaker that includes a core component. Existing breakers in the United States typically have two input terminals and two output terminals (to break line 1 and line 2 in a 240V system).

The modular controllable breaker design described herein may be used or adapted to create a controllable breaker that matches various aspects of the existing breaker that is being replaced, such as matching mounting features (e.g., how the breaker mounts into the breaker panel), shapes, terminal locations, etc.

As one example, consider a 200 A controllable main breaker. The controllable main breaker includes a core component, where the core component includes the common functionality used to function as a main breaker as well as to be controllable. For example, the core component includes the componentry of the architecture described in conjunction with FIG. 2. The core component may be of a size that fits within the envelope of existing 200 A controllable breakers to be replaced. For example, existing breakers may be overlaid to determine the intersection of common space. This may be used to determine the dimensions of the core component/package (other core component dimensions may be determined by performing similar analysis of existing breakers to be replaced or breaker slots to be filled). In some embodiments, the core component or unit includes terminals, which will be used to attach to adapters to generate particular instances or variations of controllable breakers.

For example, to produce an individual version of a controllable main breaker (e.g., to replace a specific existing main breaker), the core component is augmented with an additional piece (e.g., plastic component), where the additional piece makes up the difference between what the overall main breaker form factor should be and what the core is. In some embodiments, the added piece includes terminals that make contact with the input/output terminals of the core component. This results in a modular controllable main breaker design.

In some embodiments, a specific variation of a controllable main breaker is generated by coupling an adapter to the core component. As one example, an adaptor piece may be snapped on to a core component, where there are different adapters for different types of desired main breaker forms. As another example, a specific instance of a controllable breaker is generated by adding to molding. For example, different molds may be created around the core component.

The modular nature of the controllable main breaker described above provides manufacturing benefits. For example, different cases may be created with different terminals embedded in them that electrically connect to the terminals of the core component. The core component may snap into the case, transforming it into a desired main breaker form factor/implementation. In this example, there is a standardized core that may be transformed into various different types of breakers via adaptors, additional molding, etc. In some embodiments, the cases are designed to match various aspects or features of the existing breakers to be replaced. For example, the case may be designed to fill the slot or receptacle that is normally filled by an existing breaker.

Using such a modular controllable main breaker design, a controllable main breaker instance may be created to replace an existing main breaker by simply swapping out the existing main breaker with the new one that has been created to be of the same form. In this way, a controllable main breaker (that can also be used as a grid interconnect relay) can be installed without requiring installation of a new panel (which would involve moving loads over, inserting relays, etc.).

The use of a standardized or common core component provides simplicity in certification as well. For example, one aspect of UL certification is failure mode analysis. In this example, as multiple variants of controllable main breakers may be created starting from a base core component, only the standardized core component (which includes the functional components in various embodiments) need be tested or analyzed. Similar efficiencies in thermal testing may also be realized using such a modular controllable main breaker design. In this example, the standardized core component is a single package that includes the same set of electronics or components that is common across the various breaker variations. This allows more efficient and faster (re)certification of controllable main breakers. As shown in these examples, there is a common core component that encompasses common functionality and hardware that may be included in every design variation.

In some embodiments, the electronics for controlling the triggering (e.g., opening) of the contacts in the breaker, as well as closing/resetting of the main breaker may be external to the core component/breaker component. For example, wires from the controllable solenoid may come out of the main breaker/core component, which connect to an external controller. The controller may then put voltage on the wires to trigger the actuating mechanisms described above. Such electronics may be placed in the external unit in the event that there is not sufficient space within the portion of the main breaker that goes into a main breaker slot. For example, in some embodiments, the controllable main breaker includes the additional trigger mechanism, motor (e.g., for resetting the breaker after it is opened), an interlocking mechanism as described above, a mechanism for resetting the interlock, as well as other associated electronics. The external unit may then include, for example, additional processing logic, communications (e.g., powerline communications, WiFi componentry, etc.), etc., with a set of wires that go between the controllable main breaker component and the external unit. In some embodiments, the mechanisms for controlling the opening/closing of the main breaker as a grid interconnect relay are designed to not interfere with the safety functioning of the main breaker (e.g., so that the main breaker can still open in the event of thermal faults or short circuits).

In some embodiments, the motor for resetting the main breaker on demand is also external to the main breaker core component. As one example, after a replacement main breaker is wired into the breaker panel, and before the door of the main breaker panel is closed, a unit is installed on top of the main breaker or portion of the main breaker in the main breaker slot, where this unit includes the motor reset mechanism. In some embodiments, the third or additional controllable trigger mechanism (e.g., solenoid) may also be external to the main body or core of the main breaker. The controllable trigger mechanism may act, for example, as a type of push button that behaves as a manual trip. As one example, the replacement breaker core may include a button that may be toggled or actuated, such as a push button. A controllable solenoid and motor accessory may then be placed on the outside of the main breaker component, over the button. The controllable external motor accessory may then actuate the button on the breaker core component. Such an implementation may be used in space constrained scenarios. For example, suppose that a manual shutoff button was included in the replacement breaker, but there is not sufficient space to include a solenoid that could actuate the button. In some embodiments, the solenoid is placed in an external unit, where the solenoid is configured to push that button. Similarly with the motor, if there is insufficient space within the main breaker that goes in the slot (or slots), a user input or control that a user may toggle or actuate may be included in the main breaker component that fits within the slot, where the main breaker component is augmented with an external motor accessory that actuates the control (e.g., physical button or lever).

Retrofit Robotic Accessory

The following are additional embodiments of a controllable main breaker that also functions as a grid interface relay. Existing main breakers are designed to be difficult to sabotage or be defeated by a user. For example, even if a user attempts to hold a lever closed (to keep the circuit closed), if a fault occurs (e.g., due to a thermal fault or high current due to a short circuit event), the main breaker will still open the circuit. That is, regardless of how the user is manipulating an external reset lever or button, the main breaker will trigger in the event of a fault for safety purposes. Further, with existing main breakers, in some cases, after tripping, the lever for the breaker goes to a middle position. If the user pushes on the lever towards the on position, they are not able to turn the breaker on. Rather, the user must first switch the breaker to off and then pull it back on. Even if a person is holding the main breaker lever in the on position, internally, the main breaker will still be able to trigger due to a fault. That is, a person cannot force the main breaker to stay on by jamming the lever to one side. Within the main breaker, the main breaker mechanism will open the contacts regardless of the position of the lever.

In some embodiments, the controllable main breaker is implemented by implementing an actuator accessory or unit such as a robotic actuator device that goes over or otherwise augments or manipulates an existing main breaker, where the robotic device is configured, for example, to actuate the existing lever or button of the existing breaker. In this example, the existing breaker is able to maintain safety using the above-mentioned safety mechanisms even if the robotic device is not working properly. For example, even if the robotic device were malfunctioning and attempted to hold the breaker open, the robotic device would not be able to prevent the main breaker from opening due to a fault, as the main breaker will be able to open if needed, even if the robotic device is holding the lever in the on direction.

In some embodiments, the robotic device includes a spring-loaded mechanism that is able to snap the lever or push-button mechanism of the main breaker to the off position very quickly (opening the interface to the meter, thereby disconnecting the home from the grid). Turning back on of the main breaker (and allowing current to flow again) need not be as aggressive (e.g., a slower, more motorized action may be used to push a lever on). Here, the robotic device can both turn on and off an existing breaker.

By using such a robotic device, controllability may be added to any main breaker, without having to uninstall that existing main breaker. In some embodiments, any additional hardware for introducing controllability is included in the external robotic device, which is placed over an existing main circuit breaker. In some embodiments, the robotic device is low profile so that after installation, the door of the circuit breaker panel can still be closed. As shown in these examples, controllability of the main breaker (to make it into a controllable grid interconnect relay) is added without having to design a new type of main breaker, and UL certification would not need to be performed (or may otherwise be simplified).

In some embodiments, the robotic device receives power by connecting the robotic device to wires that run out of the panel (e.g., through a conduit), allowing the robotic device to tap into whatever voltage it needs. In other embodiments, the breaker includes tunnels in the plastic of the breaker, such that wires can be run through the surface of the breaker and end up inside of the box.

In other embodiments, rather than having wires that pass through the plastic of the breaker, a replacement breaker may be introduced that includes a plug or receptacle on its face. The robotic device may then plug directly into the connector or terminal or receptacle presented on the front surface of the main breaker. In this way, when plugged in, anything needed by the robotic device may be passed from inside the box, such as line 1 and line 2 voltage. In some embodiments, the main breaker with the receptacle, as well as the robotic actuator, are made touch-safe.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A controllable main breaker, comprising:
a main breaker sized to fit within an existing panel slot of an electrical panel, wherein the main breaker comprises a trigger to open the main breaker in response to a thermal fault or an overcurrent condition;
a controllable actuator that controllably opens the main breaker; and
a microcontroller configured to control the controllable actuator, wherein prior to commanding closing of the main breaker, the microcontroller is configured to facilitate synchronization between an onsite power source and a grid.

2. The controllable main breaker of claim 1, wherein the controllable actuator comprises a solenoid that, when triggered, mechanically opens the main breaker.

3. The controllable main breaker of claim 1, further comprising a motor configured to close the main breaker.

4. The controllable main breaker of claim 3, further comprising an electrical, mechanical, or electromechanical interlock that is configured to prevent the motor from closing the main breaker in the event that the main breaker is determined to have been opened due to one of the thermal fault or the overcurrent condition.

5. The controllable main breaker of claim 1, wherein prior to commanding opening of the main breaker, the microcontroller is configured to determine that the onsite power source is capable of forming a microgrid.

6. The controllable main breaker of claim 1, further comprising a set of sensors, wherein the set of sensors is configured to measure electrical characteristics of the grid, and wherein the microcontroller facilitates synchronization between the onsite power source and the grid at least in part by providing measured electrical characteristics of the grid to the onsite power source.

7. The controllable main breaker of claim 6, wherein the microcontroller commands closing of the main breaker based at least in part on a determination that the onsite power source is synchronized to the grid.

8. The controllable main breaker of claim 1, further comprising a communications interface, wherein the controllable main breaker is configured to communicate with the onsite power source via the communications interface.

9. The controllable main breaker of claim 8, wherein the onsite power source that the controllable main breaker is configured to communicate with comprises an inverter.

10. The controllable main breaker of claim 9, wherein status information is communicated between the inverter and the controllable main breaker.

11. The controllable main breaker of claim 1, further comprising a battery.

12. The controllable main breaker of claim 11, wherein the controllable main breaker is powered by the battery.

13. The controllable main breaker of claim 1, wherein the controllable main breaker derives power from either a load side or a grid side of the controllable main breaker.

14. The controllable main breaker of claim 1, wherein the controllable main breaker is in communication with an energy storage system (ESS).

15. The controllable main breaker of claim 14, wherein the controllable main breaker is powered by the ESS.

16. The controllable main breaker of claim 14, wherein the controllable main breaker is wirelessly paired with the ESS.

17. The controllable main breaker of claim 16, wherein the controllable main breaker connects to a wireless network formed by the ESS.

18. The controllable main breaker of claim 1, wherein when installed, the controllable main breaker boots into an open state.

19. The controllable main breaker of claim 1, wherein an amperage rating of the controllable main breaker is configurable.

\* \* \* \* \*